(12) United States Patent
Zhang et al.

(10) Patent No.: US 12,283,523 B2
(45) Date of Patent: Apr. 22, 2025

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Tiantian Zhang, Shanghai (CN); Xuezhen Jing, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 608 days.

(21) Appl. No.: 17/446,695

(22) Filed: Sep. 1, 2021

(65) Prior Publication Data

US 2022/0076997 A1 Mar. 10, 2022

(30) Foreign Application Priority Data

Sep. 9, 2020 (CN) .......................... 202010942616.6

(51) Int. Cl.
*H01L 21/768* (2006.01)
*H01L 23/522* (2006.01)
*H01L 23/532* (2006.01)

(52) U.S. Cl.
CPC .. *H01L 21/76858* (2013.01); *H01L 21/76802* (2013.01); *H01L 21/76843* (2013.01); *H01L 21/76877* (2013.01); *H01L 23/5226* (2013.01); *H01L 23/53209* (2013.01); *H01L 23/53238* (2013.01); *H01L 23/53252* (2013.01); *H01L 23/53266* (2013.01)

(58) Field of Classification Search
CPC ..................... H01L 23/5226; H01L 21/76877
See application file for complete search history.

(56) References Cited

U.S. PATENT DOCUMENTS 5,306,952 A * 4/1994 Matsuura .......... H01L 21/76843
257/E23.145
2019/0355663 A1* 11/2019 Nishikawa ........ H01L 23/53266

FOREIGN PATENT DOCUMENTS

| CN | 103794506 A | 5/2014 |
|----|-------------|--------|
| CN | 107845681 A | 3/2018 |

* cited by examiner

*Primary Examiner* — John A Bodnar
(74) *Attorney, Agent, or Firm* — Anova Law Group, PLLC (57) ABSTRACT

A semiconductor device and a fabrication method of the semiconductor device are provided. The semiconductor device includes a substrate, a source-drain plug layer in the substrate, a gate structure in the substrate, and a dielectric layer disposed over the substrate and covering the gate structure and the source-drain plug layer. The dielectric layer contains a first through-hole having a bottom exposing a top surface of the source-drain plug layer, and a second through-hole having a bottom exposing a top surface of the gate structure. Further, the semiconductor device includes an interface layer disposed on each of the top surface of the source-drain plug layer exposed by the first through-hole and the top surface of the gate structure exposed by the second through-hole.

18 Claims, 2 Drawing Sheets

SEMICONDUCTOR DEVICE AND FABRICATION METHOD THEREOF

CROSS-REFERENCES TO RELATED APPLICATIONS

This application claims the priority of Chinese patent application No. 202010942616.6, filed on Sep. 9, 2020, the entirety of which is incorporated herein by reference.

FIELD OF THE DISCLOSURE

The present disclosure generally relates to the field of semiconductor manufacturing technology and, more particularly, relates to a semiconductor device and a fabrication method thereof.

BACKGROUND

With the rapid development of semiconductor manufacturing technology, semiconductor devices have been developed towards with higher component density and higher integration degree. As the most basic semiconductor device, transistors have been widely used currently. A conventional planar transistor has substantially weak control ability on channel current, which causes a short channel effect and leads to a leakage current, and ultimately affects the electrical performance of the semiconductor device.

In a manufacturing process of the semiconductor device, the current conduction is often achieved through a metal connection structure, and then the specific function of the semiconductor device is achieved. Different semiconductor devices are often connected through metal plugs, which are connected to a gate and a source-drain region, respectively. After the metal plug is formed, an interconnection layer is formed on the metal plug for the connection with an upper metal layer. However, the formation qualities of the formed metal plug and the interconnection layer are poor, which causes poor electrical performance of the formed semiconductor device.

How to form high-quality metal plug and interconnection layer to ensure that the formed semiconductor device has desired performance is an urgent technical problem that needs to be solved. The disclosed methods and device structures are directed to solve one or more problems set forth above and other problems.

BRIEF SUMMARY OF THE DISCLOSURE

One aspect of the present disclosure includes a semiconductor device. The semiconductor device includes a substrate, a source-drain plug layer in the substrate, a gate structure in the substrate, and a dielectric layer disposed over the substrate and covering the gate structure and the source-drain plug layer. The dielectric layer contains a first through-hole having a bottom exposing a top surface of the source-drain plug layer, and a second through-hole having a bottom exposing a top surface of the gate structure. Further, the semiconductor device includes an interface layer disposed on each of the top surface of the source-drain plug layer exposed by the first through-hole and the top surface of the gate structure exposed by the second through-hole.

Optionally, the semiconductor device further includes an interconnection layer disposed on a top surface of the interface layer and fully filling each of the first through-hole and the second through-hole.

Optionally, a thickness of the interface layer is in a range of approximately 15 Å-20 Å.

Optionally, the interface layer is made of a material including a titanium-tungsten alloy, a titanium-molybdenum alloy, a tantalum-tungsten alloy, or a tantalum-molybdenum alloy.

Optionally, the interconnection layer is made of a material including one or more of tungsten, copper, silver, ruthenium, cobalt, and titanium.

Another aspect of the present disclosure includes a fabrication method of a semiconductor device. The method includes forming a dielectric layer over a substrate, and forming a first through-hole and a second through-hole by etching the dielectric layer. A bottom of the first through-hole exposes a top surface of a source-drain plug layer in the substrate, and a bottom of the second through-hole exposes a top surface of a gate structure in the substrate. Further, the method includes forming an interface layer on the exposed top surface of each of the source-drain plug layer and the gate structure.

Optionally, forming the interface layer includes: forming a barrier layer on the exposed top surface of each of the source-drain plug layer and the gate structure, and forming a reaction layer on the barrier layer. The reaction layer reacts with the barrier layer to form the interface layer on the exposed top surface of each of the source-drain plug layer and the gate structure.

Optionally, the barrier layer is made of a material including one or more of TiN, Ti, and TaN.

Optionally, a resistance of the interface layer is less than a resistance of the barrier layer.

Optionally, forming the barrier layer includes a selective growth process, an atomic layer deposition process, a chemical vapor deposition process, or a physical vapor deposition process.

Optionally, the reaction layer is made of a material including one or more of tungsten and molybdenum.

Optionally, a thickness of the interface layer is in a range of approximately 15 Å-20 Å.

Optionally, the interface layer is made of a material including a titanium-tungsten alloy, a titanium-molybdenum alloy, a tantalum-tungsten alloy, or a tantalum-molybdenum alloy.

Optionally, after forming the interface layer, the method further includes forming an interconnection layer on the interface layer. The interconnection layer fully fills each of the first through-hole and the second through-hole.

Optionally, the interconnection layer is made of a material including one or more of tungsten, copper, silver, ruthenium, cobalt, and titanium.

Optionally, forming the interconnection layer includes one or more of a selective growth process, a chemical vapor deposition process, an atomic layer deposition process, and a physical vapor deposition process.

Optionally, after forming the interconnection layer, the method further includes forming an adhesion layer on the dielectric layer, and forming a metal layer on the adhesion layer and the interconnection layer.

Optionally, the adhesion layer is made of a material including TiN, and the metal layer is made of a material including tungsten.

Optionally, etching the dielectric layer includes one or more of a wet etching process and a dry etching process.

Optionally, forming the reaction layer includes an atomic layer deposition process.

The disclosed embodiments may have following beneficial effects. In the disclosed fabrication method of the present disclosure, an interface layer may be formed on the top surface of each of the source-drain plug layer and the gate structure. Therefore, the interface layers having same properties may be formed on the top surfaces of the source-drain plug layer and the gate structure. When subsequently forming the interconnection layers on the top surfaces of the source-drain plug layer and the gate structure, the rates of forming the interconnection layers over the source-drain plug layer and the gate structure may be consistent, which may avoid the formation of holes in the interconnection layer caused by the uneven growth rate, and may improve the quality of the formed interconnection layer. At the same time, because the interface layer is formed over the source-drain plug layer, the top surface of the source-drain plug layer may be sealed, which may prevent the source-drain plug layer from being damaged in subsequent processes, and may improve the quality of the ultimately formed source-drain plug layer, thereby improving the performance and yield of the ultimately formed semiconductor devices.

Further, the resistance of the interface layer may be less than the resistance of the barrier layer. When subsequently forming the interconnection layer over the interface layer, the interface layer may reduce the resistance at the bottom of each of the first through-hole and the second through-hole, thereby reducing the contact resistance (Rc) or sheet resistance (Rs) of the formed semiconductor device, and improving the electrical performance and use performance of the formed semiconductor device.

In the disclosed semiconductor device of the present disclosure, because the interface layer is disposed on each of the top surface of the source-drain plug layer exposed by the first through-hole and the top surface of the gate structure exposed by the second through-hole, the interface layers with same material properties may be formed on the top surfaces of the exposed source-drain plug layer and the exposed gate structure. In the process of subsequently forming the interconnection layers, the interconnection layers may be grown at the same environment, such that the interconnection layers on the top surfaces of the source-drain plug layer and the gate structure may have a same growth rate, which may avoid the formation of holes in the interconnection layer caused by uneven growth rate, and may improve the performance of the ultimately formed semiconductor device. At the same time, because the interface layer is formed over the source-drain plug layer, the top surface of the source-drain plug layer may be sealed, which may prevent the source-drain plug layer from being damaged in subsequent processes, and may improve the quality of the ultimately formed source-drain plug layer.

Further, the interface layer may be made of a metal alloy, such that the resistance at each of the top surface of the exposed source-drain plug layer and the top surface of the exposed gate structure may be reduced, thereby reducing the contact resistance (Rc) or sheet resistance (Rs) of the formed semiconductor device, and improving the electrical performance and use performance of the formed semiconductor device.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

In a contact-over-active-gate (COAG) structure, an interconnection layer as a contact plug is formed over a source-drain plug layer and a gate structure, such that the source-drain plug layer and the gate structure are electrically connected to metal layers formed over the contact plug, respectively. The source-drain plug layer tends to be damaged in subsequent processes, and at the same time, a contact resistance (Rc) and a sheet resistance (Rs) of the formed semiconductor device are substantially large, which affects the electrical performance and usability of the semiconductor device, and limits the application of the semiconductor device.

Figure 1:
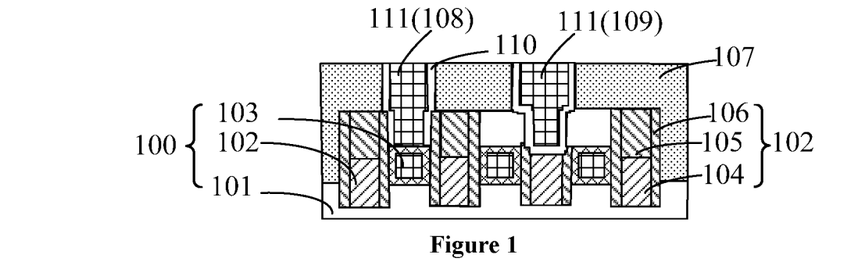
FIG. 1 illustrates a semiconductor structure corresponding to certain stage for forming a semiconductor device.

Referring to FIG. 1, the semiconductor device includes a substrate 100. The substrate 100 includes a base 101, a plurality of gate structures 102 formed over the base 101 and arranged parallel to each other, and a source-drain plug layer 103 disposed between adjacent gate structures 102. The source-drain plug layer 103 is formed on a source-drain doped layer (not shown in the Figure), and source-drain doped layers are formed in the base 101 on both sides of the gate structure 102. The gate structure 102 includes a gate dielectric layer (not shown in the Figure), a gate electrode layer 104, a protection layer 105 disposed on the top of the gate electrode layer 104, and a sidewall spacer 106 disposed on sidewalls of the gate electrode layer 104 and the protection layer 105. The semiconductor device also includes a dielectric layer 107 disposed over the substrate 100 and covering the source-drain plug layer 103 and the gate structure 102. In addition, the semiconductor device includes a first through-hole 108 formed in the dielectric layer 107 and having a bottom exposing a top surface of one source-drain plug layer 103, and a second through-hole 109 formed in the dielectric layer 107 and having a bottom exposing a top surface of the gate electrode layer 104 of one gate structure 102. Further, the semiconductor device includes a barrier layer 110 disposed at the bottom and on sidewall of each of the first through-hole 108 and the second through-hole 109, and an interconnection layer 111 disposed over the barrier layer 110 and fully fills each of the first through-hole 108 and the second through-hole 109.

The stability of the use performance of the semiconductor device formed by such method is poor, and phenomena such as failure, etc., tend to occur, which limits the application of the semiconductor device. On the one hand, the barrier layer 110 may make the contact resistance (Rc) and sheet resistance (Rs) of the formed semiconductor device be large, which affects the electrical performance of the semiconductor device. On the other hand, in subsequent etching process or cleaning process, the source-drain plug layer 103 tends to be damaged, which affects the quality of the formed semiconductor device. At the same time, the rates of forming the interconnection layers 111 in the first through-hole 108 and the second through-hole 109 are different, and the defects such as holes tend to be formed in the interconnection layer with a slow growth rate.

By forming a barrier layer on each of the top surface of the source-drain plug layer exposed by the bottom of the first through-hole and the top surface of the gate structure exposed by the bottom of the second through-hole and forming a reaction layer on the barrier layer, due to the reaction between the barrier layer and the reaction layer, an interface layer may be formed on the top surface of each of the source-drain plug layer and the gate structure. Therefore, the interface layers having same properties may be formed on the top surfaces of the source-drain plug layer and the gate structure. When subsequently forming an interconnection layer on the top surface of each of the source-drain plug layer and the gate structure, the rates of forming the interconnection layers over the source-drain plug layer and the gate structure may be consistent, which may avoid the formation of holes in the interconnection layer caused by the uneven growth rate, and may improve the quality of the formed interconnection layer. At the same time, because the interface layer is formed on the top surface of the source-drain plug layer, the top surface of the source-drain plug layer may be sealed, which may prevent the source-drain plug layer from being damaged in subsequent processes, and may improve the quality of the ultimately formed source-drain plug layer, thereby improving the performance and yield of the ultimately formed semiconductor devices.

The barrier layer may react with the reaction layer to form the interface layer, and a resistance of the interface layer may be less than the resistance of the barrier layer. When subsequently forming the interconnection layer over the interface layer, the interface layer may make the resistance at the bottom of each of the first through-hole and the second through-hole be reduced, thereby reducing the contact resistance (Rc) and sheet resistance (Rs) of the formed semiconductor device, and improving the electrical performance and use performance of the formed semiconductor device.

Figure 6:
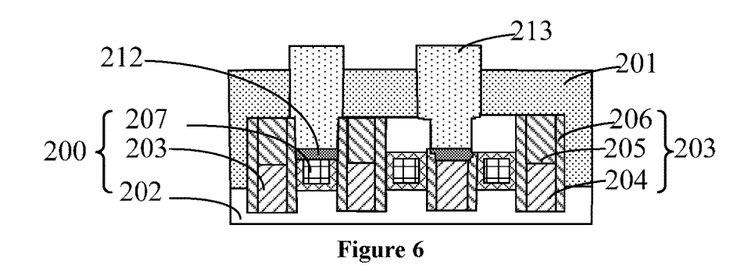
Figure 7:
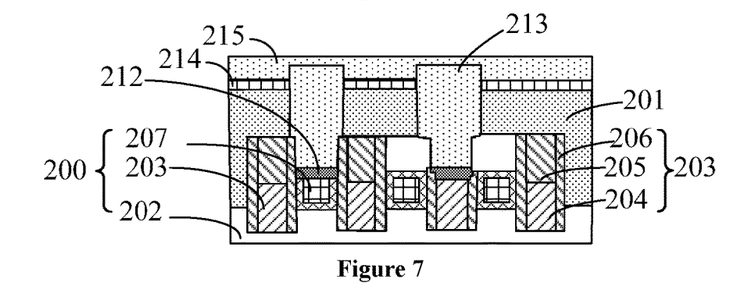
Figure 8:
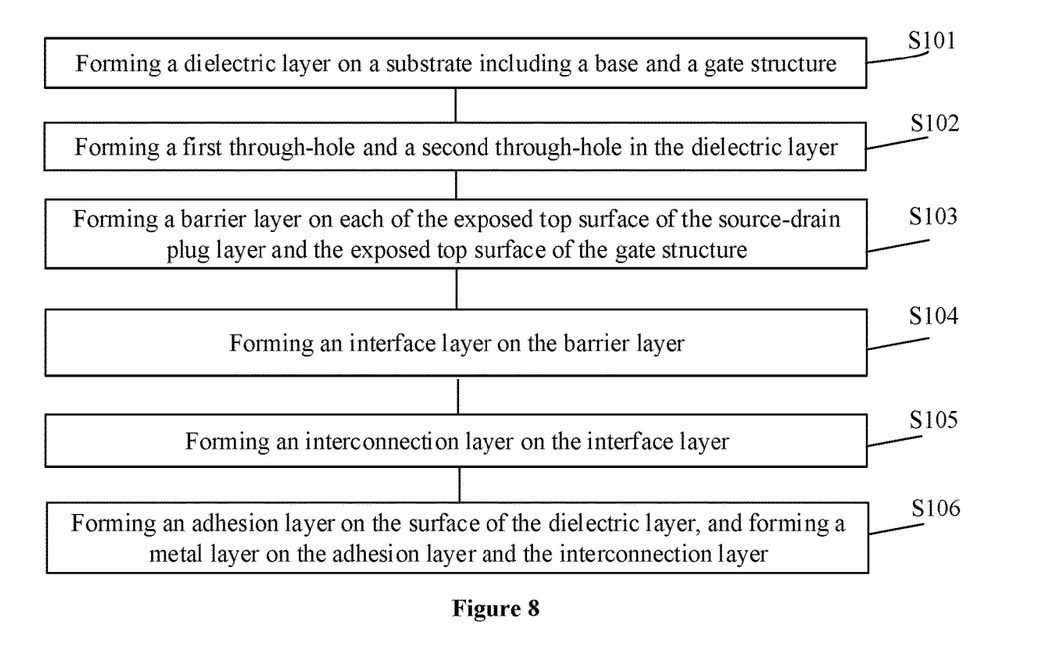
FIG. 8 illustrates a flowchart of an exemplary fabrication method of a semiconductor device consistent with various disclosed embodiments of the present disclosure.

The present disclosure provides a semiconductor device and a fabrication method thereof. FIG. 8 illustrates a flowchart of a method for forming a semiconductor device consistent with various disclosed embodiments of the present disclosure, and FIGS. 2-7 illustrate semiconductor structures corresponding to certain stages of the fabrication method.

Figure 2:
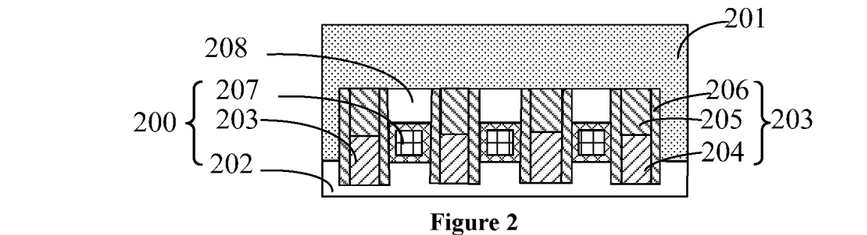
FIGS. 2-7 illustrate semiconductor structures corresponding to certain stages for forming an exemplary semiconductor device consistent with various disclosed embodiments of the present disclosure.

As shown in FIG. 8, at the beginning of the fabrication method, a dielectric layer may be formed on a substrate including a base and a gate structure (S101). FIG. 2 illustrates a corresponding semiconductor structure.

Referring to FIG. 2, a substrate 200 may be provided, and a dielectric layer 201 may be formed on the substrate 200. In one embodiment, the substrate 200 may include a base 202 and a gate structure 203 on the base 202.

In one embodiment, the base 202 may be made of monocrystalline silicon. In another embodiment, the base 202 may be made of polysilicon, or amorphous silicon. In certain embodiments, the base 202 may be made of germanium, silicon germanium, gallium arsenide, silicon on insulator (SOI), germanium on insulator (GOI), or any other semiconductor material.

In one embodiment, a plurality of fins (not shown in the Figure) arranged in parallel may be formed over the base 202, and the gate structure 203 may be across a length portion of a fin and may cover a portion of top and sidewall surfaces of the fin. In certain embodiments, fins may not be formed over the base 202.

In one embodiment, an isolation structure (not shown in the Figure) may be formed over the base 202, and the isolation structure may cover a portion of the sidewall of the fin. In one embodiment, the isolation structure may be configured to form electrical isolation.

In one embodiment, the gate structure 203 may include a gate dielectric layer (not shown in the Figure), a gate electrode layer 204 on the gate dielectric layer, a protection layer 205 on the gate electrode layer 204, and a sidewall spacer 206 on sidewalls of the gate electrode layer 204 and the protection layer 205.

In one embodiment, the gate dielectric layer may be made of a material including a high-K dielectric material, such as an oxide including $Al_2O_3$, $HfO_2$, $Ta_2O_5$, $TiO_2$, $ZrO_2$, etc. In another embodiment, the gate dielectric layer may be made of a material including any other dielectric material having a dielectric constant greater than 3.9.

In one embodiment, the gate electrode layer 204 may be made of a metal including one or more of copper, tungsten, nickel, chromium, titanium, tantalum, and aluminum.

In one embodiment, the protection layer 205 may be made of a material including silicon nitride, or silicon oxide. In another embodiment, the protection layer 205 may be made of a material including one or more of silicon carbide (SiC), silicon oxy-nitride (SiON), silicon oxy-carbide (SiOC), silicon carbo-nitride (SiCN), silicon oxy-carbo-nitride (SiOCN), and silicon carbon-boron-nitride (SiCBN).

In one embodiment, the sidewall spacer 206 may be made of a material including silicon oxide. In another embodiment, the sidewall spacer 206 may be made of a material including one or more of silicon nitride (SiN), silicon carbide (SiC), silicon oxy-nitride (SiON), silicon oxy-carbide (SiOC), silicon carbo-nitride (SiCN), silicon oxy-carbo-nitride (SiOCN), and silicon carbon-boron-nitride (SiCBN). The sidewall spacer 206 may be configured to define the position of the source-drain doped layer.

In one embodiment, forming the gate structure 203 may include a gate-last process. In other words, a dummy gate structure may be first formed over the base 202, and after the source-drain doped layer is formed, the dummy gate structure may be removed and the gate structure 203 may be formed at the position of the dummy gate structure.

In another embodiment, forming the gate structure may include a gate-first process. In other words, the gate structure 203 may be directly formed over the base 202 without pre-forming a dummy gate structure.

In one embodiment, source-drain doped layers (not shown in the Figure) may be formed in the base 202 on both sides of the gate structure 203, and a source-drain plug layer 207 may be formed over a source-drain doped layer. The source-drain plug layer 207 may be configured to achieve the electrical connection between the source-drain doped layer and an external circuit.

The source-drain plug layer 207 may be made of a metal. In one embodiment, the source-drain plug layer 207 may be made of cobalt. In another embodiment, the source-drain plug layer 207 may be made of a material including copper, aluminum, titanium, or any other metal material.

In one embodiment, more than one gate structures 203 may be arranged in parallel over the base 202. In one embodiment, the source-drain plug layers 207 may be disposed on both sides of the gate structure 203, and a quantity of the source-drain plug layers 207 may be more than one.

In one embodiment, the dielectric layer 201 may be formed over the substrate 200. A patterned layer (not shown in the Figure) may be formed on the dielectric layer 201, and the patterned layer may contain an opening. The position of the opening may correspond to a position of a through-hole for subsequently forming the interconnection layer in the dielectric layer.

In one embodiment, before forming the dielectric layer 201 over the substrate 200, a hard mask layer 208 may be formed on the top surface of the source-drain plug layer 207. A top surface of the hard mask layer 208 may be coplanar with a top surface of the protection layer 205.

In one embodiment, the dielectric layer 201 may be used as an inter-metal dielectric isolation material, and may be made of a material including one or more of silicon carbide, silicon oxide, and silicon nitride.

In one embodiment, forming the dielectric layer 201 may include a chemical vapor deposition process. In another embodiment, forming the dielectric layer 201 may include a physical vapor deposition process, or an atomic layer vapor deposition process.

Figure 3:
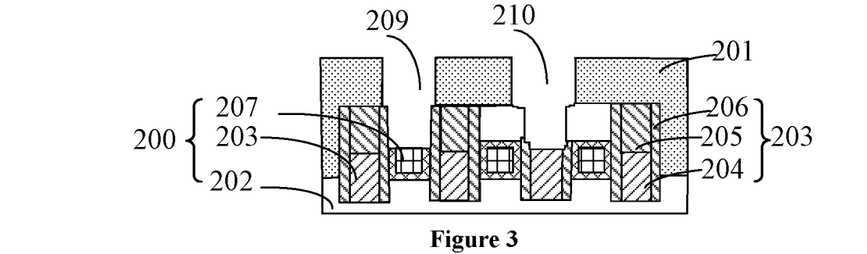

Returning to FIG. 8, after forming the dielectric layer, a first through-hole and a second through-hole may be formed in the dielectric layer (S102). FIG. 3 illustrates a corresponding semiconductor structure.

Referring to FIG. 3, the dielectric layer 201 may be etched to form a first through-hole 209 and a second through-hole 210. A bottom of the first through-hole 209 may expose a top surface of a source-drain plug layer 207 in the substrate 200, and a bottom of the second through-hole 210 may expose a top surface of a gate structure 203 in the substrate 200.

In one embodiment, a patterned layer (not shown in the Figure) may be formed on the dielectric layer 201. The dielectric layer 201 may be etched using the patterned layer as a mask, to form the first through-hole 209 and the second through-hole 210 in the dielectric layer 201.

In one embodiment, in the process of forming the first through-hole 209, the hard mask layer 208 on the top of the source-drain plug layer 207 may also be etched away until the top surface of the source-drain plug layer 207 is exposed.

In one embodiment, in the process of forming the second through-hole 210, the protection layer 205 may also be etched away until the top surface of the gate electrode layer 204 is exposed.

In one embodiment, forming the first through-hole 209 and the second through-hole 210 may include a dry etching process. In another embodiment, forming the first through-hole 209 and the second through-hole 210 may include one or more of a wet etching process and a dry etching process.

In one embodiment, the reason of using the dry etching process to form the first through-hole 209 and the second through-hole 210 may include following. The dry etching process may have strong etching directionality, and the dry etching process may have an etching rate in a longitudinal direction greater than an etching rate in a lateral direction, which may ensure that the surrounding devices may not be damaged during the process of forming the first through-hole 209 and the second through-hole 210.

In one embodiment, the first through-hole 209 and the second through-hole 210 may not be on a same horizontal line. Therefore, in the process of forming the first through-hole 209 and the second through-hole 210, a portion of the source-drain plug layer 207 may be covered and may not be exposed.

In one embodiment, the positions of the first through-hole 209 and the second through-hole 210 may be determined according to requirements of actual pattern design. In another embodiment, any other pattern may be formed. In other words, the positions of the first through-hole 209 and the second through-hole 210 may not be fixed.

Figure 4:
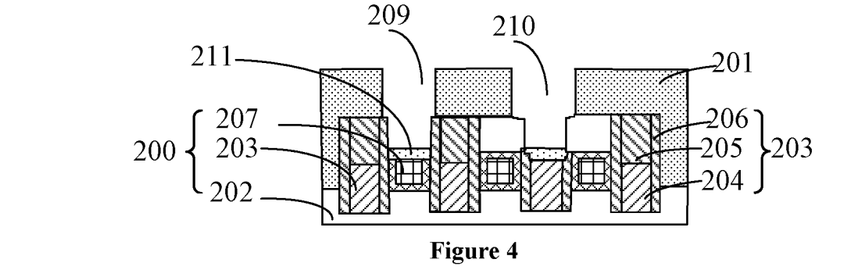
Figure 5:
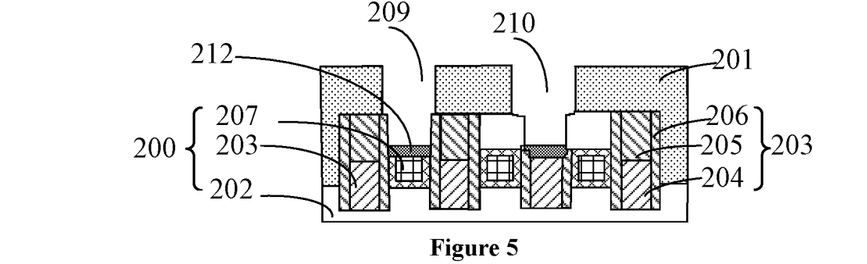

An interface layer may be formed on exposed top surface of each of the source-drain plug layer and the gate structure, and details of forming the interface layer may refer to FIG. 4 and FIG. 5.

Returning to FIG. 8, after forming the first through-hole and the second through-hole, a barrier layer may be formed on each of the exposed top surface of the source-drain plug layer and the exposed top surface of the gate structure (S103). FIG. 4 illustrates a corresponding semiconductor structure.

Referring to FIG. 4, a barrier layer 211 may be formed on each of the exposed top surface of the source-drain plug layer 207 and the exposed top surface of the gate structure 203. In one embodiment, the barrier layer 211 may be formed at the bottom of each of the first through-hole 209 and the second through-hole 210.

In one embodiment, the barrier layer 211 may be made of a material including TiN. In another embodiment, the barrier layer 211 may be made of a material including one or more of TiN, Ti, or TaN.

In one embodiment, one the one hand, the barrier layers 211 may be configured to protect the exposed source-drain plug layer 207 and the gate structure 203, and on the other hand, the barrier layers 211 may block diffusion ions in a subsequently formed interconnection layer from damaging the source-drain plug layer 207.

In one embodiment, forming the barrier layer 211 may include a selective growth process. In another embodiment, forming the barrier layer 211 may include an atomic layer deposition process, a chemical vapor deposition process, or a physical vapor deposition process.

In one embodiment, the reason of using the selective growth process to form the barrier layer 211 may include that the barrier layer 211 formed by the selective growth process may gradually grow upward from each of the bottom of the first through-hole 209 and the bottom of the second through-hole 210. Therefore, the barrier layer 211 may not be formed on the sidewall of each of the first through-hole 209 and the second through-hole 210, such that an etching process to remove the barrier layer 211 on the sidewall of each of the first through-hole 209 and the second through-hole 210 may not be required, which may reduce the process steps and may reduce the damages on the device.

Returning to FIG. 8, after forming the barrier layer, an interface layer may be formed on the exposed top surface of each of the source-drain plug layer and the gate structure (S104). FIG. 5 illustrates a corresponding semiconductor structure.

Referring to FIG. 5, a reaction layer (not shown in the Figure) may be formed on the barrier layer 211, and the reaction layer may react with the barrier layer 211 to form an interface layer 212 on the surface of each of the source-drain plug layer 207 and the gate structure 203.

In one embodiment, due to the reaction between the reaction layer and the barrier layer 211, the barrier layer 211 may be used up to form the interface layer 212. A resistance of the interface layer 212 may be less than a resistance of the barrier layer 211.

In one embodiment, the reaction layer and the barrier layer 211 may undergo a substitution reaction and the non-metallic substances in the barrier layer 211 may be replaced. In another embodiment, the reaction layer may chemically react with the barrier layer 211 to have the resistance of the formed interface layer 212 smaller than the resistance of the barrier layer 211. Therefore, during the process of subsequently forming the interconnection layer, the contact resistance Rc or the sheet resistance Rs at the bottom of each of the first through-hole 209 and the second through-hole 210 may be reduced, which may improve the electrical performance of the formed semiconductor device.

In one embodiment, the reaction layer may react with the barrier layer 211 to form the interface layer 212 on the exposed top surface of each of the source-drain plug layer 207 and the gate structure 203, such that the interface layers 212 having the same properties may be formed on the top surfaces of the source-drain plug layer 207 and the gate structure 203. Therefore, in the process of subsequently forming the interconnection layer in the first through-hole 209 and the second through-hole 210, the rates of forming the interconnection layers over the source-drain plug layer 207 and the gate structure 203 may be consistent, which may improve the quality of the formed interconnection layer. When the interconnection layers in the first through-hole 209 and the second through-hole 210 are formed at different rates, the interconnection layer with a faster growth rate in the through-hole may diffuse into the interconnection layer with a slower growth rate in the through-hole. In view of this, the interconnection layer with a slower growth rate in the through-hole may contain holes, and, thus, the formation quality of the interconnection layer may be poor. When the growth rates of the interconnection layers in the first through-hole 209 and the second through-hole 210 are the same, holes may be prevented from being formed in the interconnection layer, such that the formation quality of the interconnection layer may be improved, and the performance of the ultimately formed semiconductor device may be improved.

In one embodiment, because the interface layer 212 is formed over the source-drain plug layer 207, the top surface of the source-drain plug layer 207 may be sealed, which may prevent the source-drain plug layer 207 from being damaged in subsequent processes, may improve the quality of the ultimately formed source-drain plug layer 207, and may improve the performance and yield of the ultimately formed semiconductor devices.

In one embodiment, the reaction layer may be made of a material including tungsten. In one embodiment, forming the reaction layer may include an atomic layer deposition process, and process parameters for forming the reaction layer may include: gases including tungsten chloride and hydrogen, where a flow rate of the tungsten chloride is in a range of approximately 50 sccm-500 sccm, and a flow rate of hydrogen is in a range of approximately 300 sccm-3000 sccm, a temperature in a range of approximately 300° C.-600° C., and a pressure in a range of approximately 5 torr-40 torr. In another embodiment, the reaction layer may be made of a material including molybdenum.

In one embodiment, the reaction layer may fully react with the barrier layer 211 (i.e., the barrier layer 211 may be used up) to form the interface layer 212. In another embodiment, a portion of the barrier layer 211 with a certain thickness may be remained. In other words, after the reaction layer fully reacts with the barrier layer 211, the barrier layer 211 may not be used up, and a portion of the barrier layer 211 with a certain thickness may be retained. Although there is still a portion of the barrier layer 211 with a certain thickness, because the resistance of the formed interface layer 212 is smaller than the resistance of the barrier layer 211, in the process of subsequently forming the interconnection layer, the contact resistance Rc or the sheet resistance Rs at the bottom of each of the first through-hole 209 and the second through-hole 210 may still be reduced, such that the electrical performance of the formed semiconductor device may be improved.

In one embodiment, a thickness of the interface layer 212 may be in a range of approximately 15 Å-20 Å. When the thickness of the interface layer 212 is less than 15 Å, the thickness of the formed interface layer 212 may be too small, which may cause the adhesion to the interconnection layer to be poor when subsequently forming interconnection layer, and may cause poor molding quality between the interconnection layer and each of the source-drain plug layer 207 and the gate structure 203. At the same time, because the thickness of the formed interface layer 212 is too small, the top of the source-drain plug layer 207 may not be effectively sealed, and the source-drain plug layer 207 may not be effectively protected. When the thickness of the interface layer 212 is greater than 20 Å, the thickness of the formed interface layer 212 may be too large, which may cause a corresponding decrease in a volume of the subsequently formed interconnection layer, may increase the resistance of the ultimately formed semiconductor device, and may reduce the electrical performance of the semiconductor device.

In one embodiment, the interface layer 212 may be made of a material including a titanium-tungsten alloy. In another embodiment, the interface layer 212 may be made of a material including a titanium-molybdenum alloy, a tantalum-tungsten alloy, or a tantalum-molybdenum alloy.

Returning to FIG. 8, after forming interface layer, an interconnection layer may be formed on the interface layer (S105). FIG. 6 illustrates a corresponding semiconductor structure.

Referring to FIG. 6, after forming the interface layer 212, an interconnection layer 213 may be formed on the interface layer 212, and the interconnection layer 213 may fully fill each of the first through-hole 209 and the second through-hole 210.

The interconnection layer 213 may be made of a metal material. In one embodiment, the interconnection layer 213 may be made of tungsten. In another embodiment, the interconnection layer 213 may be made of copper, silver, ruthenium, cobalt, titanium, or any other metal material.

In one embodiment, forming the interconnection layer 213 may include a selective growth process. In another embodiment, forming the interconnection layer 213 may include one or more of a chemical vapor deposition process, an atomic layer deposition process, and a physical vapor deposition process.

In one embodiment, the reason of using the selective growth process to form the interconnection layer 213 may include following. On the one hand, because the interconnection layer 213 formed by the selective growth process gradually grows upward from the top surface of the interface layer 212, the formed interconnection layer 213 may have desired compactness. On the other hand, because the dielectric layer 201 of the sidewalls of the first through-hole 209 and the second through-hole 210 undergoes a precursor treatment, the surface of the dielectric layer 201 may contain a large amount of polar bonds or charges, and the surface of the interconnection layer 213 may also contain a large amount of polar bonds or charges, such that the interconnection layer 213 and the dielectric layer 201 may attract each other, and the interconnection layer 213 may be easily grown on the sidewall of each of the first through-hole 209 and the second through-hole 210, thereby forming the interconnection layer 213 with desired quality.

In one embodiment, the precursor treatment may refer to a process of performing a treatment on each surface before forming the interconnection layer 213. In one embodiment, a top surface of the interconnection layer 213 may be higher than the top surface of the dielectric layer 201.

Returning to FIG. 8, after forming the interconnection layer, an adhesion layer and a metal layer may be formed (S106). FIG. 7 illustrates a corresponding semiconductor structure.

Referring to FIG. 7, after forming the interconnection layer 213, an adhesion layer 214 may be formed on the surface of the dielectric layer 201, and a metal layer 215 may be formed on the adhesion layer 214 and the interconnection layer 213.

In one embodiment, the adhesion layer 214 may be made of TiN. In one embodiment, forming the adhesion layer 214 may include an atomic layer deposition process. In one embodiment, the metal layer 215 may be made of tungsten. In one embodiment, forming the metal layer 215 may include a chemical vapor deposition process.

After the metal layer 215 is formed, the surface of the metal layer 215 may be planarized, such that the surface of the metal layer 215 may be flat.

Correspondingly, the present disclosure also provides a semiconductor device. Referring to FIG. 7, the semiconductor device may include a substrate 200, a source-drain plug layer 207 disposed in the substrate 200, and a gate structure 203 disposed in the substrate 200. The semiconductor device may also include a dielectric layer 201 disposed over the substrate 200 and covering the gate structure 203 and the source-drain plug layer 207. The dielectric layer 201 may contain a first through-hole 209 having a bottom exposing a top surface of the source-drain plug layer 207, and a second through-hole 210 having a bottom exposing a top surface of the gate structure 203. Moreover, the semiconductor device may include an interface layer 212 disposed on each of the top surface of the source-drain plug layer 207 exposed by the first through-hole 209 and the top surface of the gate structure 203 exposed by the second through-hole 210.

In one embodiment, because the interface layer 212 is disposed on each of the top surface of the source-drain plug layer 207 exposed by the first through-hole 209 and the top surface of the gate structure 203 exposed by the second through-hole 210, the interface layers 212 with same material properties may be formed on the top surfaces of the exposed source-drain plug layer 207 and the exposed gate structure 203. In the process of subsequently forming the interconnection layers, the interconnection layers may be grown at a same environment, such that the interconnection layers on the top surfaces of the source-drain plug layer 207 and the gate structure 203 may have a same growth rate, which may avoid the formation of holes in the interconnection layer caused by uneven growth rate, and may improve the performance of the ultimately formed semiconductor device.

In one embodiment, because the interface layer 212 is formed over the source-drain plug layer 207, the top surface of the source-drain plug layer 207 may be sealed, which may prevent the source-drain plug layer 207 from being damaged in subsequent processes, and may improve the quality of the ultimately formed source-drain plug layer 207.

Further, the semiconductor device may include an interconnection layer 213 disposed on the top surface of the interface layer 212 and fully filling each of the first through-hole 209 and the second through-hole 210.

In one embodiment, the interconnection layer 213 may be made of tungsten. In another embodiment, the interconnection layer 213 may be made of copper, silver, ruthenium, cobalt, titanium, or any other metal material.

In one embodiment, forming the interconnection layer 213 may include a selective growth process. In another embodiment, forming the interconnection layer 213 may include one or more of a chemical vapor deposition process, an atomic layer deposition process, and a physical vapor deposition process.

In one embodiment, a thickness of the interface layer 212 may be in a range of approximately 15 Å-20 Å. When the thickness of the interface layer 212 is less than 15 Å, the thickness of the formed interface layer 212 may be too small, which may cause the adhesion to the interconnection layer to be poor when subsequently forming the interconnection layer, and may cause poor molding quality between the interconnection layer and each of the source-drain plug layer 207 and the gate structure 203. At the same time, because the thickness of the formed interface layer 212 is too small, the top of the source-drain plug layer 207 may not be effectively sealed, and the source-drain plug layer 207 may not be effectively protected. When the thickness of the interface layer 212 is greater than 20 Å, the thickness of the formed interface layer 212 may be too large, which may cause a corresponding decrease in a volume of the subsequently formed interconnection layer, may increase the resistance of the ultimately formed semiconductor device, and may reduce the electrical performance of the semiconductor device.

In one embodiment, the interface layer 212 may be made of a material including a titanium-tungsten alloy, a titanium-molybdenum alloy, a tantalum-tungsten alloy, or a tantalum-molybdenum alloy.

The interface layer 212 may reduce the resistance of the top surface of the exposed source-drain plug layer and the top surface of the exposed gate structure, thereby reducing the contact resistance (Rc) or sheet resistance (Rs) of the formed semiconductor device, and improving the electrical performance and use performance of the formed semiconductor device.

The disclosed embodiments may have following beneficial effects. In the disclosed fabrication method of the present disclosure, an interface layer may be formed on the top surface of each of the source-drain plug layer and the gate structure. Therefore, the interface layers having same properties may be formed on the top surfaces of the source-drain plug layer and the gate structure. When subsequently forming the interconnection layers on the top surfaces of the source-drain plug layer and the gate structure, the rates of forming the interconnection layers over the source-drain plug layer and the gate structure may be consistent, which may avoid the formation of holes in the interconnection layer caused by the uneven growth rate, and may improve the quality of the formed interconnection layer. At the same time, because the interface layer is formed over the source-drain plug layer, the top surface of the source-drain plug layer may be sealed, which may prevent the source-drain plug layer from being damaged in subsequent processes, and may improve the quality of the ultimately formed source-drain plug layer, thereby improving the performance and yield of the ultimately formed semiconductor devices.

Further, the resistance of the interface layer may be less than the resistance of the barrier layer. When subsequently forming the interconnection layer over the interface layer, the interface layer may reduce the resistance at the bottom of each of the first through-hole and the second through-hole, thereby reducing the contact resistance (Rc) or sheet resistance (Rs) of the formed semiconductor device, and improving the electrical performance and use performance of the formed semiconductor device.

In the disclosed semiconductor device of the present disclosure, because the interface layer is disposed on each of the top surface of the source-drain plug layer exposed by the first through-hole and the top surface of the gate structure exposed by the second through-hole, the interface layers with same material properties may be formed on the top surfaces of the exposed source-drain plug layer and the exposed gate structure. In the process of subsequently forming the interconnection layers, the interconnection layers may be grown at the same environment, such that the interconnection layers on the top surfaces of the source-drain plug layer and the gate structure may have a same growth rate, which may avoid the formation of holes in the interconnection layer caused by uneven growth rate, and may improve the performance of the ultimately formed semiconductor device. At the same time, because the interface layer is formed over the source-drain plug layer, the top surface of the source-drain plug layer may be sealed, which may prevent the source-drain plug layer from being damaged in subsequent processes, and may improve the quality of the ultimately formed source-drain plug layer.

Further, the interface layer may be made of a metal alloy, such that the resistance at each of the top surface of the exposed source-drain plug layer and the top surface of the exposed gate structure may be reduced, thereby reducing the contact resistance (Rc) or sheet resistance (Rs) of the formed semiconductor device, and improving the electrical performance and use performance of the formed semiconductor device.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A semiconductor device, comprising:
   a substrate;
   a source-drain plug layer in the substrate;
   a gate structure in the substrate;
   a dielectric layer, disposed over the substrate and covering the gate structure and the source-drain plug layer, wherein the dielectric layer contains a first through-hole having a bottom exposing a top surface of the source-drain plug layer, and a second through-hole having a bottom exposing a top surface of the gate structure; and
   an interface layer, disposed on each of the top surface of the source-drain plug layer exposed by the first through-hole and the top surface of the gate structure exposed by the second through-hole, the interface layer being made of a material including a titanium-molybdenum alloy or a tantalum-molybdenum alloy, and a width of the interface layer in a horizontal direction being greater than a width of the source-drain plug layer in the horizontal direction;
   an interconnection layer disposed on a top surface of the interface layer and fully filing each of the first through-hole and the second through-hole;
   an adhesion layer formed on a top surface of the dielectric layer, a top surface of the adhesion layer being lower than top surfaces of the interconnection layer; and
   a metal layer formed on the top surface of the adhesion layer and the top surfaces of the interconnection layer, a top surface of the metal layer being higher than the top surfaces of the interconnection layer, and a material of the adhesion layer being different from a material of the metal layer.

2. The semiconductor device according to claim 1, wherein:
   a thickness of the interface layer is in a range of approximately 15 Å-20 Å.

3. The semiconductor device according to claim 1, wherein:
   the interconnection layer is made of a material including one or more of tungsten, copper, silver, ruthenium, cobalt, and titanium.

4. A fabrication method of a semiconductor device, comprising:
   forming a dielectric layer over a substrate;
   forming a first through-hole and a second through-hole by etching the dielectric layer, wherein a bottom of the first through-hole exposes a top surface of a source-drain plug layer in the substrate, and a bottom of the second through-hole exposes a top surface of a gate structure in the substrate; and
   forming an interface layer on the exposed top surface of each of the source-drain plug layer and the gate structure, the interface layer being made of a material including a titanium-molybdenum alloy or a tantalum-molybdenum alloy, and a width of the interface layer in a horizontal direction being greater than a width of the source-drain plug layer in the horizontal direction;
   forming an interconnection layer on the interface layer, wherein the interconnection layer fully fills each of the first through-hole and the second through-hole;
   forming an adhesion layer on a top surface of the dielectric layer, a top surface of the adhesion layer being lower than top surfaces of the interconnection layer; and
   forming a metal layer on the top surface of the adhesion layer and the top surfaces of the interconnection layer, a top surface of the metal layer being higher than the top surfaces of the interconnection layer, and a material of the adhesion layer being different from a material of the metal layer.

5. The method according to claim 4, wherein forming the interface layer includes:
   forming a barrier layer on the exposed top surface of each of the source-drain plug layer and the gate structure, and
   forming a reaction layer on the barrier layer, wherein the reaction layer reacts with the barrier layer to form the interface layer on the exposed top surface of each of the source-drain plug layer and the gate structure.

6. The method according to claim 5, wherein:
   the barrier layer is made of a material including one or more of TiN, Ti, and TaN.

7. The method according to claim 5, wherein:
   a resistance of the interface layer is less than a resistance of the barrier layer.

8. The method according to claim 5, wherein:
   forming the barrier layer includes a selective growth process, an atomic layer deposition process, a chemical vapor deposition process, or a physical vapor deposition process.

9. The method according to claim 5, wherein:
   the reaction layer is made of a material including molybdenum.

10. The method according to claim 4, wherein:
a thickness of the interface layer is in a range of approximately 15 Å-20 Å.

11. The method according to claim 4, wherein:
the interconnection layer is made of a material including one or more of tungsten, copper, silver, ruthenium, cobalt, and titanium.

12. The method according to claim 4, wherein:
forming the interconnection layer includes one or more of a selective growth process, a chemical vapor deposition process, an atomic layer deposition process, and a physical vapor deposition process.

13. The method according to claim 4, wherein:
the adhesion layer is made of a material including TiN, and
the metal layer is made of a material including tungsten.

14. The method according to claim 4, wherein:
etching the dielectric layer includes one or more of a wet etching process and a dry etching process.

15. The method according to claim 5, wherein:
forming the reaction layer includes an atomic layer deposition process.

16. The semiconductor device according to claim 1, wherein:
the source-drain plug layer is made of a material without molybdenum; and
the gate structure is made of a material without molybdenum.

17. The semiconductor device according to claim 1, wherein the interconnection layer is made of a material without molybdenum.

18. The semiconductor device according to claim 1, wherein:
the adhesion layer is made of a material including TiN; and
the metal layer is made of a material including tungsten.

* * * * *